United States Patent [19]

Natale et al.

[11] Patent Number: 5,289,423
[45] Date of Patent: Feb. 22, 1994

[54] BANK ERASABLE, FLASH-EPROM MEMORY

[75] Inventors: Virginia Natale, Milan; Gianluca Petrosino, Missaglia; Flavio Scarra, Agrate Brianza, all of Italy

[73] Assignee: SGS-Thomson Microelectronics s.r.l., Milan, Italy

[21] Appl. No.: 792,478

[22] Filed: Nov. 15, 1991

[30] Foreign Application Priority Data

Nov. 16, 1990 [IT] Italy ................. 83649 A/90
Nov. 20, 1990 [IT] Italy ................. 83650 A/90

[51] Int. Cl.⁵ ................................. G11C 7/00
[52] U.S. Cl. .................. 365/218; 365/230.03; 365/900; 257/320; 257/322
[58] Field of Search .......... 365/218, 185, 900, 230.03; 257/320, 322

[56] References Cited

U.S. PATENT DOCUMENTS

| | | | |
|---|---|---|---|
| 4,853,895 | 8/1989 | Mitchell et al. | 257/320 |
| 5,065,364 | 11/1991 | Atwood et al. | 365/185 |
| 5,101,250 | 3/1992 | Arima et al. | 257/320 |
| 5,136,541 | 8/1992 | Arakawa | 365/218 |
| 5,155,705 | 10/1992 | Goto et al. | 365/218 |

FOREIGN PATENT DOCUMENTS 0436475  10/1991  European Pat. Off. .
2572836  11/1985  France .

Primary Examiner—Joseph A. Popek
Assistant Examiner—Tan Nguyen
Attorney, Agent, or Firm—Seed and Berry

[57] ABSTRACT

Each common source region of the cells of a row of a FLASH-EPROM matrix may be segmented and each segment is individually connected to a secondary source line patterned in a second level metal layer by a plurality of contacts between each common source region and patterned portions of a first level metal and through as many interconnection vias between the latter patterned portions of the first level of metal and the relative secondary source line patterned in the second metal layer. The secondary source lines are brought out of the matrix orthogonally to the bit lines and may be connected to a dedicated selection circuitry, thus permitting the erasing by groups or banks of cells of the FLASH-EPROM memory.

20 Claims, 3 Drawing Sheets

BANK ERASABLE, FLASH-EPROM MEMORY

DESCRIPTION

1. Technical Field

The present invention relates to a FLASH-EPROM, or more particularly, to a FLASH memory having individually addressable source regions for rows in the memory to permit selectable sectors of the memory to be separately erased.

2. Background of the Invention

FLASH memories are rapidly finding numerous new fields of application. Their success is primarily due to the relatively small dimension of the unit cell, which is about equal to that of a traditional EPROM cell, coupled to the ability of being electrically erased. These characteristics ideally place FLASH memories between traditional EPROM memories (less expensive) and the EPROM memories (much more expensive) from which they differ on one hand by being electrically erasable although the erasing can be carried out on the memory matrix as a whole, while an EPROM memory may be erased byte by byte. On the other hand, a typical EPROM unit cell is about four times larger than a FLASH cell.

This explains why the FLASH memories have conquered large sectors of the market where it is important to have nonvolatile, large-capacity memories which may be electrically erased eventually, but whose cost is relatively moderate.

One of the industrial sectors which is particularly interested to this type of memories is the automotive sector where on-board reprogramming of the memories is an indispensable requirement, e.g., for modifying the controlling parameters of a motor from time to time, or for recording the operating history of a motor between services, and the like.

In this, as in other areas of utilization of FLASH memories, it would be highly desirable to be able to erase not the memory as a whole, but only a selectable portion of sector thereof. Such a possibility would be extremely useful. In the automotive area, for example, manufacturers would find useful to install a FLASH memory wherein a system's managing program (ABS, control parameters of the motor, etc.) could be permanently stored, while on the other hand being able to modify the data stored by the program itself (e.g., timing and carburation parameters, temperature, etc., which have been acquired during the use of the vehicle and which must be erased after having been read by the computer of the maintenance workshop).

SUMMARY OF THE INVENTION

An object of the present invention is that of providing a FLASH-memory wherein the erasing may take place in a partialized manner on selectable portions of the memory matrix without affecting other portions thereof.

This objective is accomplished by the FLASH memory object of the present invention, having an architecture characterized by source regions which are individually selectable by appropriate selection circuitry of the memory. Partitioned, distinct source regions for memory cells within the matrix permit each source region to be individually addressed. The source regions are distinct for each pair of rows, such that two rows have a common source region that is individually addressable.

According to one embodiment, source contact lines are patterned in a second level metal to provide electrical contact to the individual source regions. Through interconnection via between the second and first level metal and through contacts between the first level metal and the semiconductor, the source region of the memory cells arranged on a same row of the matrix are connected. Metal two that provides electrical contact to these partitioned source regions may be brought out of the FLASH matrix orthogonally to the bit lines. This permits the selection of portions of the memory matrix to be erased by a dedicated external selection circuitry and to apply the erasing voltage through the selected secondary source contact lines, which during reading are customarily connected to a common ground node.

In an alternative embodiment, the FLASH memory has a single metal level wherein the erasing may be performed in a partialized manner on selectable portions of the memory matrix, without affecting other portions of the matrix.

According to one alternative embodiment, source contact lines are patterned in a first level metal layer, parallel to the bit lines, and connected to the isolated source regions. The source contact lines are electrically connected to respective source interconnection lines which are also patterned in the same first level metal layer with the source contact lines and the bit lines. Or, alternatively, the source contact lines or source interconnection lines are in a polysilicon layer. These source interconnection lines may be brought out of the matrix and individually connected to an external selection circuit for enabling the selection of a certain group of cells having their source regions connected to a certain interconnection line. Because said source interconnection lines are patterned in the same first level metal layer orthogonally to the bit lines and to the segmented source contact lines, the bit lines are crossed by the source interconnection lines. The electrical continuity of each bit line is ensured by means of an "electrical underpath" which is realized by utilizing patterned portions of an existing underlying conducting layer, e.g., a polysilicon layer of a first or second level, in which the control gate lines, word lines of the memory cells are patterned.

In this way the FLASH EPROM memory of the invention may be erased by selectable blocks of cells while being fabricable through a single metal layer standard fabrication process.

The "electrical underpaths" made by means of "crosses" of polysilicon along each single bit line of the matrix determine a certain increase of the electrical resistance of these lines and consequently an increase of the propagation delay of a logic signal along the same bit lines. However, it has been observed that by limiting the number of underpaths of the source lines (column-wise) and therefore the number of electrical polysilicon bypasses for each bit line, the increase of the propagation delay may be comfortably maintained within limits which are compatible with an acceptable normal access time of the memory, which is established during the design of the memory device. For example, by employing four source interconnection lines in an entire memory matrix, which may be bypassed in pairs by utilizing two series of polysilicon crosses, i.e., two crosses of polysilicon along each bit line, the entire memory matrix may be erased by four distinctly selectable blocks of cells, by biasing the cells of each selected block through a respective SECONDARY source interconnection line. The presence of two polysilicon crosses on each bit line will not penalize in any remarkable manner the access time of the memory.

The various aspects and advantages of the invention will become more evident through the following description of a preferred embodiment and the reference to the appended drawings.

DETAILED DESCRIPTION OF THE INVENTION

Figure 1:
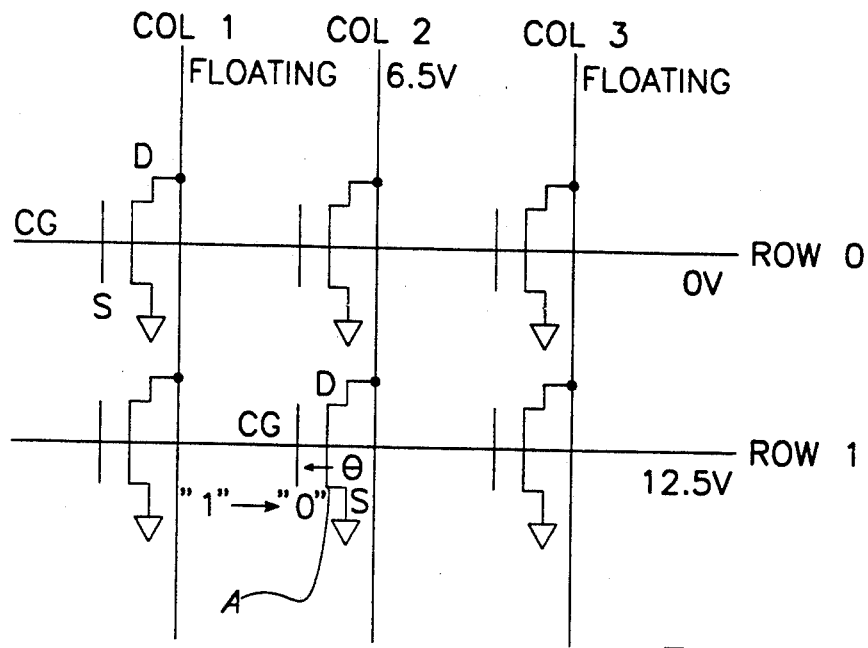
FIG. 1 schematically shows the typical circuit arrangement of a FLASH memory cell matrix.

The organization in a matrix or rows and columns of the cells of a FLASH-EPROM memory is schematically depicted in FIG. 1. For illustrative purposes, the biasing conditions during a programming phase for the cell A are indicated in FIG. 1. The drain, source and control gate terminals of each unit memory cell are indicated with the letters D, S, and CG, respectively. As may be easily observed, programming, reading and eventually erasing of the memory cells takes place by applying appropriate voltages across the three terminal structure of the single memory cells through gate lines word lines relative to rows of cells; namely: row 0, row 1, . . ., drain lines (bit lines), relative to columns of cells; namely: col 1, col 2, col 3, . . ., of the array depicted in FIG. 1. The source regions of the single memory cells are substantially connected in common, normally to a common ground potential during the reading of the data stored in the memory. In particular, the erasing of a cell takes place, notably, by applying a sufficient potential difference between the source to which a voltage of about 12V is commonly applied, and the gate which may be connected to ground potential, while the drain region is left floating.

Figure 2:
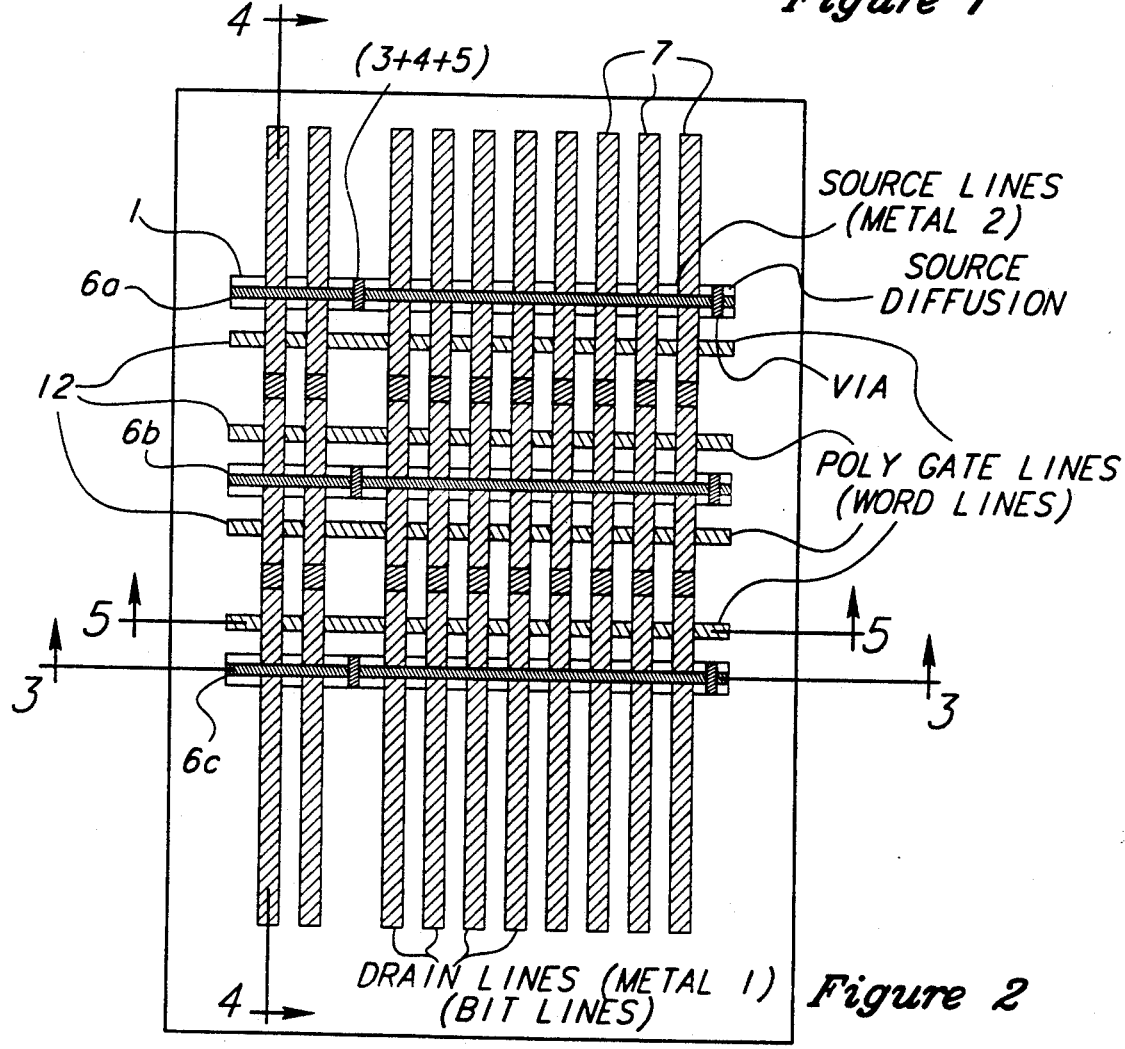
FIG. 2 is a partial schematic plan view showing the architecture of a cell matrix of a FLASH memory which is erasable per bands of groups of cells, in accordance with the present invention.

As schematically depicted in the partial plan view of FIG. 2, the architecture of the FLASH-memory matrix of the invention contemplates the interruption of the normally continuous and interconnected diffused regions commonly known as "source lines" constituting partitioned and distinct common source regions for all the cells arranged on a same row of the matrix and their separate connection to a series of conducting lines, either metal or polysilicon, or secondary source lines through one or more contacts formed with each distinct source region. Contacts to the source region are patterned in a first level metal layer (metal 1) through a first isolation dielectric layer 14, and through the same number of respective interconnection vias formed between said patterned portions of the metal 1 and patterned portions of a second level metal (metal 2), which is purposely formed at least over the area occupied by the memory cell matrix in the integrated device, through a second isolation dielectric layer 15. The secondary source lines, patterned in metal 2, are brought out of the FLASH matrix orthogonally to the bit lines (DRAIN LINES) and may be connected to an external dedicated selection circuitry (not shown in the figures).

Figure 3:
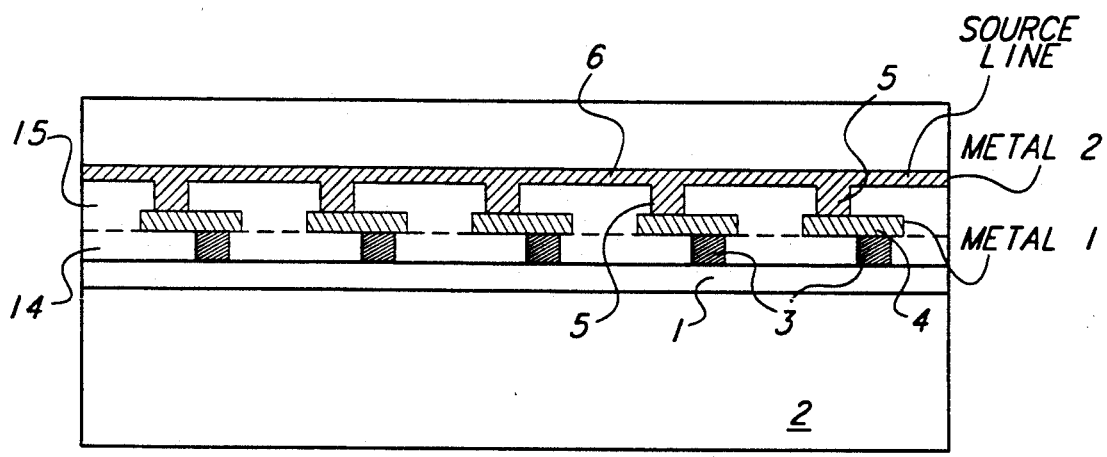
FIG. 3 is a partial schematic sectional view along the section line A—A of FIG. 2.
Figure 4:
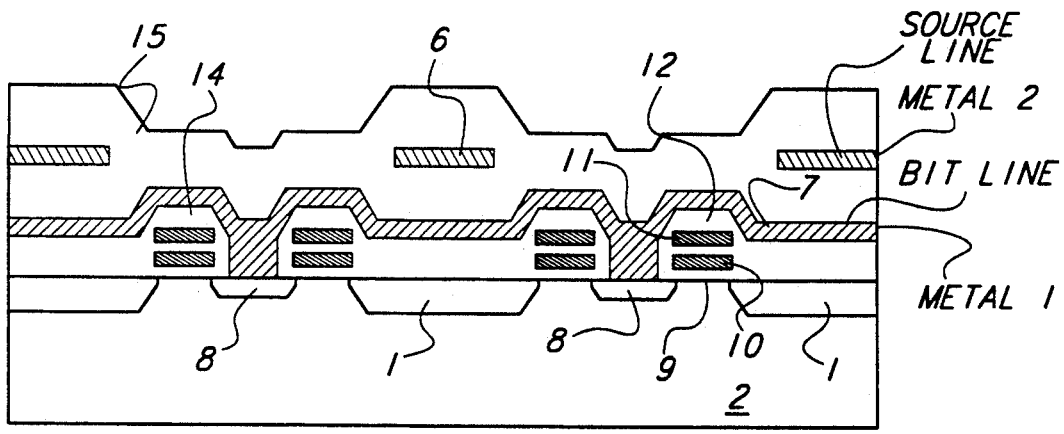
FIG. 4 is a partial schematic sectional view along the section line B—B of FIG. 2.
Figure 5:
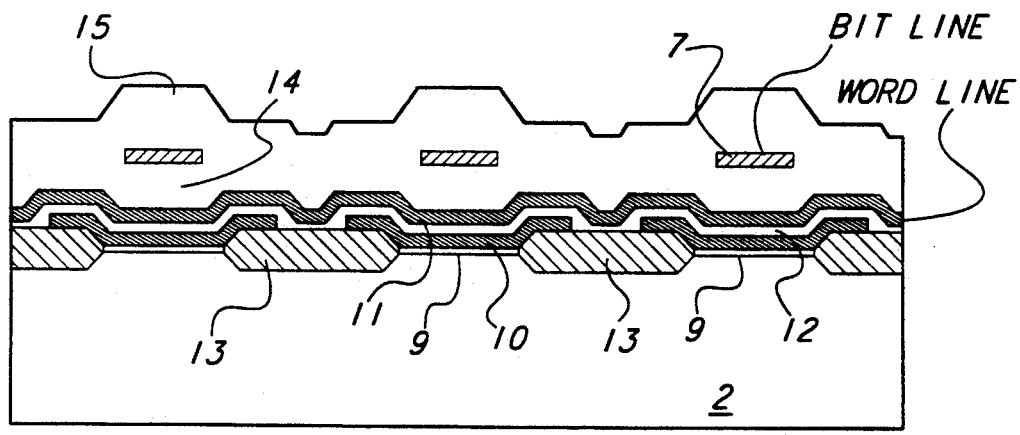
FIG. 5 is a partial schematic sectional view along the section line C—C of FIG. 2.

The architecture of the FLASH memory matrix of the invention is clearly depicted in the three sectional views shown in FIGS. 3, 4, and 5, respectively.

A partial schematic sectional view along the section lines A—A of FIG. 2 is shown in FIG. 3. Each distinct source diffusion region or portion thereof formed in the semiconducting substrate 2 and common to unit cells arranged on a same row of the matrix is electrically connected through a plurality of contacts 3 to patterned portions 4 of a first level metal layer and through as many interconnection vias 5 to a line 6 patterned in a second level metal layer (metal 2).

For completeness of illustration, the cross-sectional view along the section line B—B of FIG. 2, shown in FIG. 4, and the cross-sectional view along the section line C—C of FIG. 2, shown in FIG. 5, clearly show the structure of the FLASH-EPROM cells which form the matrix. In particular, in the cross section of FIG. 4, taken along a bit line, the arrangement of the cells aligned along a same column or drain line 7 may be observed. The diffused drain regions are indicated with 8 while the gate structure of each cell is formed by the thin dielectric gate layer 9, by a first level layer of polycrystalline silicon (poly 1) 10, which forms the floating gate of the device, by an intermediate dielectric insulating layer 11 and by a second level polycrystalline silicon layer (poly 2) 12 which constitutes the control gate, i.e., the gate lines or word lines of the device. In the sectional view, taken along a word line or gate line, along the section line C—C, orthogonal to the sectional line B—B of FIG. 2, the cross section of the cells arranged along a same row of the matrix may be observed. In this sectional view, the field isolation structure formed by the field oxide strips 13 may be also observed.

Depending upon the number of cells which are aligned along a same row of the matrix (number of bytes or words), the electrical connection between the respective source diffusion (e.g., common to all the cells of a same row) and the overlying secondary source line 6, patterned in metal 2, may be realized through a plurality of conductive paths (i.e., contact 3, patterned portion 4 of metal interconnection via 5, uniformly distributed along the length of the row (e.g., every eight or sixteen bit lines), in order to reduce the electrical resistance of the connection.

The ends of the various secondary source lines 6, brought out of the matrix orthogonally to the bit lines 7, may be interconnected as needed into separate groups, each group of source lines may then be individually connected to a dedicated selection circuit, thus permitting the erasing of the FLASH memory matrix by selectable groups or banks of cells.

In the example of FIG. 2, the presence of three secondary source lines, 6a, 6b, and 6c, respectively, which are individually connectable to an external selection circuit, permits the erasing by banks of cells. In fact, the cells of the top row and eventually of other overlying rows (not visible in FIG. 2) may be erased by biasing them through the respective secondary source lines 6a, . . ., and/or the cells of the two central rows of the figure, may be erased by biasing them through the common secondary source line 6b, and/or the cells of the lower row of the figure and eventually of other underlying rows of cells (not visible in the figure), may be erased, by biasing them through the respective secondary source lines 6c, . . . . Therefore, in the embodiment shown, the matrix may be erased by banks of two adjacent rows of cells for each secondary source line, through which they may be separately biased from the other rows of cells of the matrix.

Naturally, a common source region for the cells of a row of the matrix may also be segmented, for example, in two segments and, similarly, the relative secondary source line patterned in metal 2 may be segmented, in order to permit a further subdivision in selectable groups of the cells of the matrix. Also, the distinct source regions may be formed for each row, rather than a pair of rows, if desired.

Figure 6:
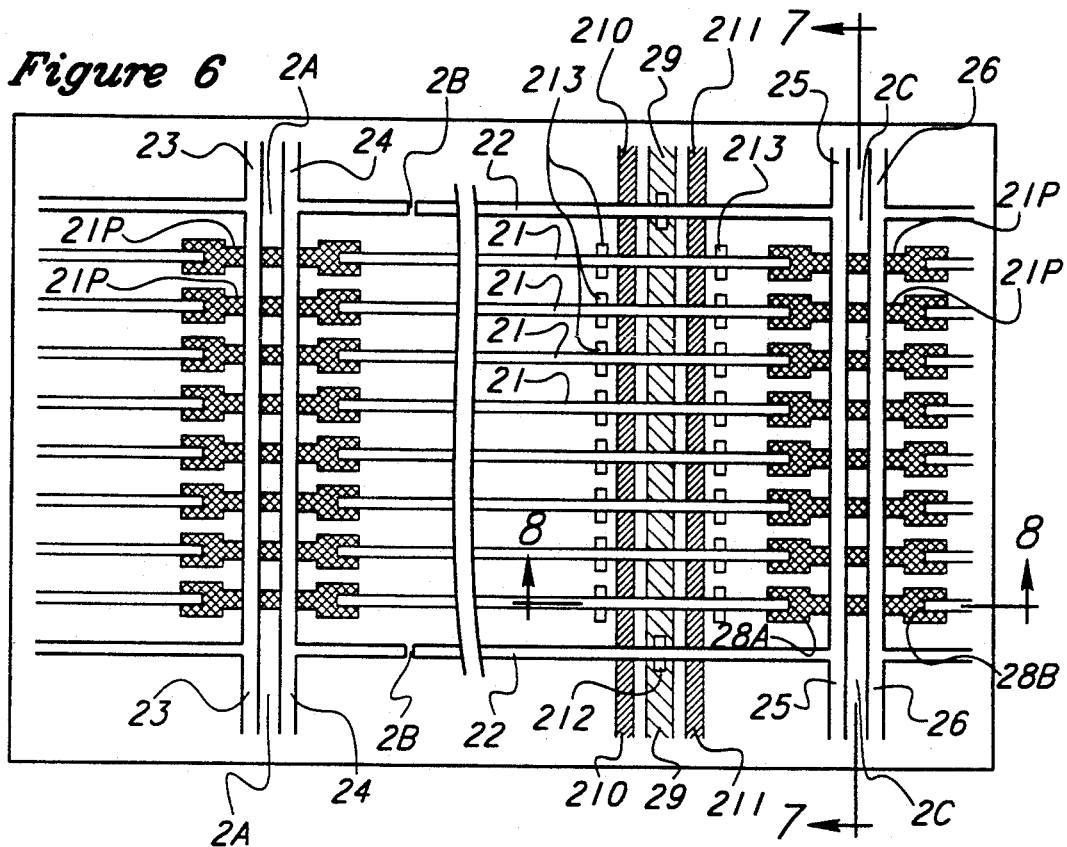
FIG. 6 is a simplified schematic plan view showing the organization of the source interconnections by groups or sectors of the memory cell matrix and of the relative electrical underpaths, formed in poly 2, along the bit lines of the matrix.

According to an alternative embodiment as shown in plane view of FIG. 6, a FLASH-EPROM memory matrix is comprised of an array of bit lines 20, of source contact lines 22 and of source interconnection lines 23, 24, 25, and 26, all patterned, in accordance with this embodiment of the invention, in a single metal layer (e.g., metal 1) which is normally present in these types of integrated devices. In the view of FIG. 6, the matrix is shown "sideways" from the traditional nomenclature used for features in the memory matrix. That is, the row, word lines 210 and 211 are vertical and the column, bit lines 21 are horizontal.

The simplified plan view of FIG. 6 does not show all the other features of the memory cell matrix which are not pertinent to a clear illustration of the subject matter of the present invention. Any skilled technician will be perfectly capable of visualizing the structural feature of the FLASH-EPROM which has not been shown in the figures.

According to this embodiment of the present invention, each source contact line 22 is interrupted at points A, B, and C. Each segment of source contact line 22 is electrically connected to the source regions 29 (diffused source line) of a certain number of unit cells disposed along a same row of the matrix, through standard contacts which may be formed concurrently with the formation of the so-called drain contacts, which connects the drain region of each cell disposed along a same column of the matrix to a relative bit line. The source contact lines that are parallel to the bit lines may contact one or more partitioned source regions. The source contact lines are interrupted, that is, they extend as a common, electrically connected member for only a selected distance. The electrical path is interrupted at A, B, and C, and electrical contact to other partitioned source regions is made by a different electrical path on a different source contact line.

Keeping in mind that in the illustration of FIG. 6, the rows extend vertically while the columns extend horizontally, the pattern of one diffused source region 29, which constitutes a source region common to cells disposed along a row of the matrix is shown. As is known, each diffused source region 29 is formed parallel to and between two adjacent control gate lines, word lines 210 and 211, which are part of the gate structure of the cells disposed along two adjacent rows of the matrix, respectively. The contacts 212 between the diffused source region 29 to aligned segments of source contact lines 22 may be formed concurrently with the drain contacts 213 which connect each single drain region belonging to a given cell to a respective bit line 21 to which the drain regions of all cells disposed along a column of the matrix are connected. Of course the arrangement depicted is repeated a certain number of times between any two spaced-apart source interconnect lines 24 and 25, and so forth. Indeed the partial illustration of FIG. 6 is modularly expanded in all directions. Theoretically, to each segment of a source contact line 22, shown in the simplified partial view of FIG. 6, an unlimited number of unitary memory cells may have their diffused source regions 29 connected, as will be easily recognized by the skilled person.

Each segment of each interrupted source contact line 22, is in turn connected in common with other segments of other interrupted source contact lines 22, on the same rows of source regions 29, through respective source interconnection lines 23, 24, 25, and 26. These source interconnection lines 23-26 are patterned in the same metal layer of first level. These source interconnection lines 23-26 intersect orthogonally the respective series of segments of interrupted source contact lines 22. The source interconnection lines 23-26 run orthogonally to the bit lines, over poly interconnects of the bit lines. Preferably the source interconnection lines 23-26 are formed in pairs 23-24 and 25-26, for reducing the number of interconnects needed for the bit lines.

The electrical continuity of each bit line 21 in these crossing zones with a pair of source interconnection lines 23-26 may be realized by forming an electrical underpath 21p in a polycrystalline silicon layer of a second level (poly 2). The second level polysilicon layer (poly 2) in which these bypasses may be patterned is the same conducting layer with the control gate lines, word lines 210 and 211 in FIG. 6.

Figure 7:
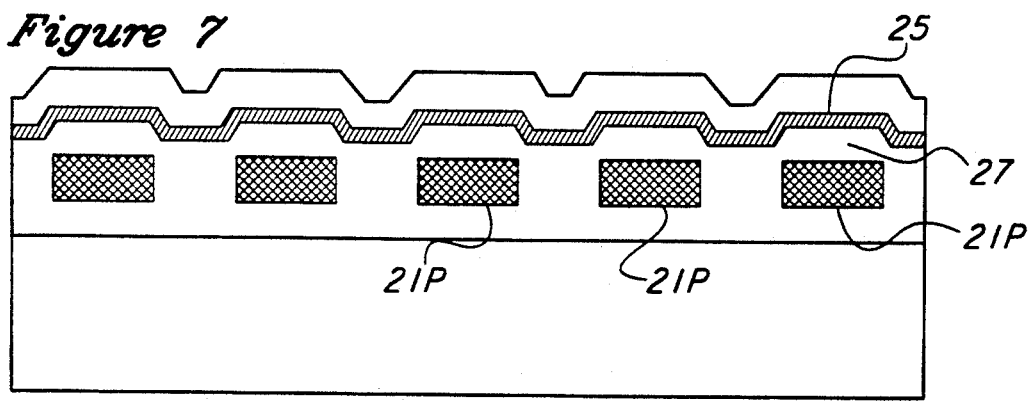
FIG. 7 is a simplified partial sectional view along the section line II—II of FIG. 6.

These conducting bypasses 21p, made in poly 2, are shown in the partial sectional view of FIG. 7. The source interconnection line 25 is patterned in a metal layer which is deposited on a dielectric layer 27, which electrically isolates the patterned portions from the electrical bypasses 21p, patterned in poly 2.

Figure 8:
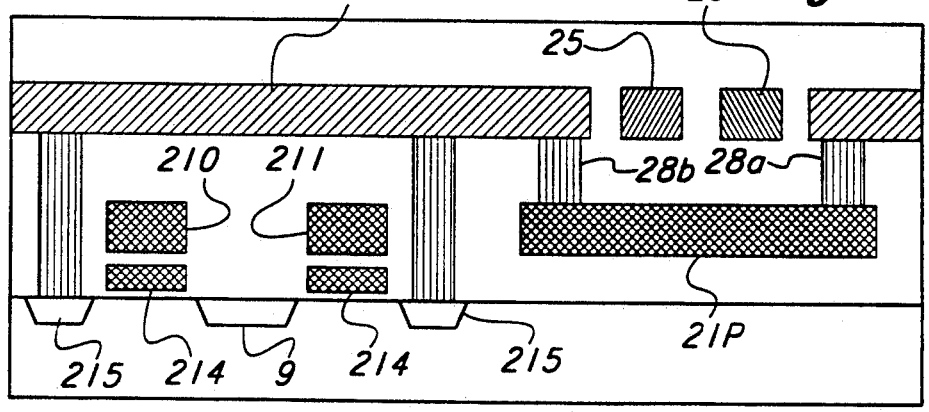
FIG. 8 is a simplified partial sectional view along section line III—III of FIG. 6.

In FIG. 8, the electrical connection between the electrical bypass portion 21p of polysilicon of second level (poly 2) and the respective truncated ends of an interrupted bit line 1, patterned in the same first level metal layer, is shown. In the same metal layer a pair of source interconnection lines 25 and 26, running orthogonally to the bit lines, are also patterned. The electrical connection may be realized by forming two contacts 28a and 28b, respectively, on the patterned portion 21p of second level polysilicon (poly 2).

A cross section of two cells disposed on the same column and formed in adjacent rows is schematically visible in the cross section of FIG. 8. The respective channel regions between the common source region 29 and the respective drain regions 215 are topped by the respective gate structures, each comprising a floating gate 214 over which is laid the control gate lines 210 and 211 (word lines), respectively, which are patterned in the same polysilicon layer of second level (poly 2) as the electrical bypasses 21b. The bit line 21 contacts the drain of each memory cell as is known in the art.

As it may be easily observed in FIG. 6, the four source interconnection lines 23-26, patterned in metal 1 while requiring only two interruptions of the patterned bit lines, permit a subdivision of the memory matrix, for the purpose of allowing an erasing per groups, in four groups or banks of cells, which may be individually selected by means of a dedicated selection circuitry, in order to permit the erasing of one or more of these four groups in any combination among each other, without affecting the cells of the nonselected groups.

The source interconnection lines 23 and 24 are provided in the matrix at the locations desired for partitioning the memory matrix into the desired number of individually erasable blocks. If each row, or alternatively pair of rows, is desired to be individually erasable, electrically separate source contact lines 22 must be provided for each source region. Thus, at every four cells along a bit line, an underpath interconnect 21p is provided. On the other hand, if control of banks of four, eight, or one quarter of the rows on the chip is acceptable, the underpath interconnect 21p need be provided only every 8, 16, or for one quarter of the cells along the bit line. The source contact line 22 extends over the selected number of source regions 29, one source region for each two rows, to selectively control the voltage on all cells it contacts.

The source contact lines 22 extend from the source interconnection lines 23-26 at the locations needed to ensure that an entire source region 29 is held at the selected voltage with an adequate current path. As shown in FIG. 6, the source contact lines 22 extend from a common source interconnection line 22 every 8 cells. This could be every 7 cells, every 6 cells, every 12 cells, every 16 cells, or the like, depending on the resistance of source region 29 and the ability to handle the required current flow.

The interruptions A, B, and C in the source contact lines 22 have been shown as terminations or physical breaks in the source contact lines 22. In alternative embodiments, this providing of an electrical path to selected partitioned source regions 29 is provided by making or failing to make contact to a source region 29 which the contact lines 22 pass over. Gating the source contact lines 22 within the matrix or other methods could be used to provide electrical isolation between source contact lines 22 for distinct source regions.

The switching circuitry to apply the desired voltage to selected source contact line 22 in respective interconnecting lines 23-25 is in the peripheral region of the chip. MOS transistors, CMOS invertors, or many other known switching devices (many suitable switching devices being known in the art) are used to selectively output the desired voltage and gate it to the selected source interconnect lines. Given the teachings herein, one of ordinary skill in art could select these switching devices for providing the desired selectivity and current path.

A plurality of embodiments for contacting the source diffusions of an individual row line, or two adjacent row lines, to permit bank erasing of selected rows, have been shown and discussed in detail. One embodiment uses two metal layers (FIGS. 1-5), and the other embodiment uses a single metal layer (FIGS. 6-8). Those of ordinary skill in the art will appreciate that architectures and structures other than those disclosed herein could be used to provide this same result. For example, either the bit lines or the source contact lines could be wholly a polysilicon layer, formed in poly 3 or poly 4, and the other a metal layer. Alternatively, the bit lines could each be individual, continuous metal strips, and the source contact lines be connected by polysilicon underpath interconnects as necessary, in a manner similar to that shown in FIGS. 6-8 for the bit lines. Alternatively, the contact to the source diffusions could be spaced further apart, and contact the source every 16 cells, every 32 cells, or possibly at the edges of the blocks of memory array. The source contact lines could, in one embodiment, run parallel to the bit lines and contact the desired source diffusions at selected locations.

Given the teachings herein, equivalent structure which operates in the same ways to provide the same result could be designed by those of ordinary skill in the art. Such alternative designs fall within the scope of the invention, the invention being defined by claims and not restricted to a particular embodiment shown herein.

We claim:

1. A FLASH-EPROM memory formed by a plurality of unit memory cells integrated in a semiconductor substrate, each cell having a drain region, a gate structure and a source region, the cells being organized in a matrix of rows and columns being individually addressable through a first family of individually selectable parallel conducting lines word lines and a second family of individually selectable parallel conducting lines (bit lines), patterned in a first level metal layer disposed on a first isolating dielectric layer, each word line being part of said gate structure of the cells aligned along a certain row and each bit line being connected through contacts formed through said first isolating dielectric layer to a drain region of the cells aligned along a certain column, the memory cells being erasable as a group by application of an erasing voltage to common source regions formed in said semiconducting substrate; characterized by comprising:

a third family of individually selectable parallel conducting lines (SECONDARY SOURCE LINES) and patterned in a second level metal layer disposed over a second insulating dielectric layer laying over said conducting lines of said second family (bit lines);

each SECONDARY SOURCE LINE of said third family of lines being connected to a common source region of the unit memory cells belonging to a certain row between said common source region through at least a contact and a patterned portion of said first level metal layer and an interconnection via between said patterned portion and said conducting line, thus permitting the erasing of groups of unit cells of said matrix sharing a common source region through a selected conducting SECONDARY SOURCE LINE of said third family of lines.

2. A FLASH-EPROM according to claim 1 wherein said conducting lines of said third family of lines runs parallel above said common source diffused regions of unit cells belonging to respective rows of the matrix.

3. A FLASH-EPROM memory according to claim 1 wherein said third family of conducting lines is brought out of the area occupied by said matrix of unit cells through a side of said area orthogonal to the side through which said second family of conducting lines (bit lines) are brought out.

4. A FLASH-EPROM memory formed by a plurality of unit memory cells integrated in a semiconductor substrate, each cell having a drain region, a gate structure and a source region, the cells being organized in a matrix of rows and columns and being individually addressable through a first family of individually selectable parallel conducting lines word lines and a second family of individually selectable parallel conducting lines (bit lines) patterned in a first level metal layer disposed on an isolating dielectric layer, each line word line of said first family of lines being part of said gate structure of the cells aligned along a certain row and each bit line being connected through contacts formed through said isolating dielectric layer to a drain region of the cells aligned along a certain column, the memory cells being erasable as a group by application of an erasing voltage to common source regions formed in said semiconducting substrate, characterized by comprising:

a third family of parallel, segmented, source contact lines, patterned in the same metal layer of first level, running parallel in the same metal layer of first level, running parallel to and alternately with a plurality of parallel lines of second family (bit lines);

each segment of said segmented source contact lines being connected to a common source region of unit cells disposed along a certain row of the matrix by means of at least a contact formed through said isolating dielectric layer;

a fourth family of individually selectable parallel conducting source interconnection lines, patterned in the same metal layer of first level, each orthogonally crossing and connecting in common a plurality of aligned segments of said source contact lines and orthogonally crossing said conducting lines of said second family (bit lines) in interruption zones thereof;

electrical continuity of each of said lines belonging to said second family of lines (bit lines) in the interruption zones with each of said source interconnection lines being realized by means of an electrical underpath through a patterned portion of an existing conducting layer, in which said conducting lines of said first level word lines are patterned;

the cells of said memory matrix being erasable by groups, showing a common connected source region, through a selected source interconnection line of said fourth family of lines.

5. The FLASH-EPROM memory according to claim 4 wherein said source interconnection lines are in a number multiple of two and are physically arranged in pairs of parallel lines, each pair of source interconnection lines crossing the lines of said second family of lines (bit lines) through a single interruption zone of the latter.

6. A FLASH-EPROM memory array formed by a plurality of memory cells, comprising:

a plurality of drain regions formed in a substrate for respective memory cells within said array;

a plurality of distinct source regions formed in said substrate and adjacent respective drain region, each said source regions being physical common to a plurality of memory cells;

channel regions in said substrate between said respective drain regions and said source regions;

floating gates overlying said substrate over said channel regions and being separate by a dielectric layer from said substrate;

control gates overlying respective floating gates;

a plurality of distinct source contact lines, each electrically coupled to respective distinct source regions so that each distinct source region is electrically isolable from other distinct source regions for attaching one of said distinct source regions to a voltage potential different from other source regions; and selection circuitry coupled to said source contact lines for applying a desired voltage potential to selected, distinct source contact lines.

7. The FLASH-EPROM memory of claim 6, further comprising an interrupted source diffusion forming a plurality of said source regions.

8. The FLASH-EPROM memory of claim 7 wherein the source contact lines are connected electrically by source interconnection lines, the source interconnection lines crossing said drain region.

9. The FLASH-EPROM memory of claim 8 wherein electrical continuity of said drain regions is realized by means of an electrical underpath through a patterned portion of an existing conducting layer.

10. The FLASH-EPROM memory of claim 6 wherein said distinct source contact lines are connected to certain of said source regions using a contact through at least the dielectric layer.

11. The FLASH-EPROM memory of claim 10, further comprising an interrupted source diffusion forming a plurality of said source regions.

12. A FLASH-EPROM memory array formed by a plurality of memory cells, comprising:

a plurality of drain regions formed in a substrate for respective memory cells within said array;

a plurality of partitioned source diffusions formed in said substrate and adjacent respective drain regions, each of said partitioned source diffusions forming a plurality of distinct source regions;

channel regions in said substrate between said respective drain regions and the distinct source regions;

floating gates overlying said substrate over said channel regions and being separate by a dielectric layer from said substrate;

control gates overlying respective floating gates;

a plurality of distinct source contact lines electrically coupled to the source regions so that each distinct source region is electrically isolable from other distinct source regions for attaching said source regions to a desired voltage potential; and selection circuitry coupled to said source contact lines for applying the desired voltage potential to selected, distinct source contact lines.

13. The FLASH-EPROM memory of claim 12 wherein said source contact lines are common to a plurality source regions, so that the plurality of source regions is electrically isolable from other source regions.

14. The FLASH-EPROM memory of claim 13 wherein the source contact lines are formed from a single metal layer.

15. The FLASH-EPROM memory of claim 12 wherein each said source contact line is connected electrically to respective source regions so that each distinct source region is electrically isolable from other distinct source regions.

16. The FLASH-EPROM memory of claim 15 wherein the source contact lines are formed from a single metal layer.

17. The FLASH-EPROM memory of claim 12 wherein said source contact lines are connected to certain of said source regions using a contact through at least the dielectric layer.

18. The FLASH-EPROM memory of claim 17 wherein the source contact lines are connected electrically by source interconnection lines, the source interconnection lines crossing said drain region.

19. The FLASH-EPROM memory of claim 18 wherein electrical continuity of said drain regions is realized by means of an electrical underpath through a patterned portion of an existing conducting layer.

20. The FLASH-EPROM memory of claim 19 wherein said source contact lines are connected to certain of said distinct source regions using a contact through at least the dielectric layer.

* * * * *